United States Patent
Morihara et al.

(10) Patent No.: US 10,480,536 B2
(45) Date of Patent: Nov. 19, 2019

(54) FAN UNIT FIXING STRUCTURE AND ELECTRONIC EQUIPMENT

(71) Applicant: MITSUBISHI ELECTRIC CORPORATION, Tokyo (JP)

(72) Inventors: Takafumi Morihara, Tokyo (JP); Fuqiang Han, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 48 days.

(21) Appl. No.: 15/567,701

(22) PCT Filed: Aug. 4, 2015

(86) PCT No.: PCT/JP2015/072040
§ 371 (c)(1),
(2) Date: Oct. 19, 2017

(87) PCT Pub. No.: WO2017/022070
PCT Pub. Date: Feb. 9, 2017

(65) Prior Publication Data
US 2018/0119709 A1  May 3, 2018

(51) Int. Cl.
| | |
|---|---|
| *F04D 29/66* | (2006.01) |
| *F04D 29/40* | (2006.01) |
| *F04D 29/60* | (2006.01) |
| *H05K 7/20* | (2006.01) |
| *F04D 25/06* | (2006.01) |
| *F04D 17/16* | (2006.01) |

(Continued)

(52) U.S. Cl.
CPC ....... *F04D 29/668* (2013.01); *F04D 25/0613* (2013.01); *F04D 29/403* (2013.01); *F04D 29/601* (2013.01); *F04D 29/602* (2013.01); *H05K 7/20172* (2013.01); *F04D 17/16* (2013.01); *F04D 19/002* (2013.01); *F04D 25/02* (2013.01)

(58) Field of Classification Search
CPC .... F04D 19/002; F04D 29/646; F04D 29/325; F04D 29/263; F04D 29/60; F04D 29/626
See application file for complete search history.

(56) References Cited

U.S. PATENT DOCUMENTS

| | | | | |
|---|---|---|---|---|
| 5,060,901 A | * | 10/1991 | Lathrop | F04D 25/08 |
| | | | | 248/343 |
| 8,322,974 B2 | * | 12/2012 | Chen | F04D 29/668 |
| | | | | 415/119 |

(Continued)

FOREIGN PATENT DOCUMENTS

| | | |
|---|---|---|
| JP | 5-4559 U | 1/1993 |
| JP | 2000-232276 A | 8/2000 |

(Continued)

OTHER PUBLICATIONS

International Search Report, issued in PCT/JP2015/072040 (PCT/ISA/210), dated Nov. 2, 2015.

*Primary Examiner* — Long T Tran
(74) *Attorney, Agent, or Firm* — Birch, Stewart, Kolasch & Birch, LLP

(57) ABSTRACT

Notched portions and positioning projecting portions are elastically engaged with each other to hold a fan unit at a fixing position in a housing, in a state in which the fan unit is placed at the fixing position.

7 Claims, 5 Drawing Sheets

(51) Int. Cl.
 *F04D 19/00* (2006.01)
 *F04D 25/02* (2006.01)

(56) References Cited

U.S. PATENT DOCUMENTS

| | | | |
|---|---|---|---|
| 2007/0154300 A1* | 7/2007 | Liang | F04D 25/166 415/119 |
| 2010/0025017 A1* | 2/2010 | Zhang | F04D 25/0613 165/104.31 |
| 2010/0158671 A1* | 6/2010 | Lin | F04D 25/0613 415/119 |
| 2011/0156554 A1* | 6/2011 | Hirota | F04D 25/0613 312/236 |
| 2013/0064662 A1* | 3/2013 | Gong | F04D 25/0613 415/213.1 |
| 2014/0027604 A1 | 1/2014 | Gong | |
| 2015/0016987 A1* | 1/2015 | Yamamoto | F04D 19/002 415/213.1 |
| 2015/0023779 A1* | 1/2015 | Li | F04D 19/002 415/119 |

FOREIGN PATENT DOCUMENTS

| | | |
|---|---|---|
| JP | 2005-197421 A | 7/2005 |
| JP | 2013-89897 A | 5/2013 |
| JP | 2014-175350 A | 9/2014 |
| WO | WO 2014/106898 A1 | 7/2014 |

* cited by examiner

FAN UNIT FIXING STRUCTURE AND ELECTRONIC EQUIPMENT

TECHNICAL FIELD

The present invention relates to a fan unit fixing structure that fixes a fan unit having a fan device for rotating a fan and a fan holder for holding the fan device to a housing of electronic equipment, and the electronic equipment.

BACKGROUND ART

Conventionally, a method of forcedly circulating air in the housing of electronic equipment by using rotations of a fan in order to reduce a rise in the internal temperature of the electronic equipment has been widely used.

However, a problem is that when a fan device for rotating a fan is fixed directly to the housing of the electronic equipment, a vibration occurring in the fan device due to rotations of the fan propagates and reaches the housing, and noise increases.

In contrast with this, in electronic equipment described in Patent Literature 1, a fan unit is fixed, via a vibration proof fan cover, to the housing of electronic equipment. This vibration proof fan cover is made from an elastic material, and includes a cover body for covering an outer surface of the fan unit, and two or more support projecting portions integrally provided in this cover body. The fan unit described in Patent Literature 1 is a member corresponding to the above-mentioned fan device.

In the electronic equipment described in Patent Literature 1, the fan unit is elastically supported with respect to the housing by the support projecting portions of the above-mentioned vibration proof fan cover. As a result, because a vibration occurring in the fan unit is absorbed by the vibration proof fan cover, the propagation of the vibration from the fan unit to the housing of the electronic equipment is suppressed, and noise can be reduced.

CITATION LIST

Patent Literature

Patent Literature 1: Japanese Unexamined Patent Application Publication No. 2000-232276

SUMMARY OF INVENTION

Technical Problem

Because when a fan holder which is made from an elastic material, like the above-mentioned vibration proof fan cover, is screwed to the housing of electronic equipment, the fan holder itself is compressed by the screw fastening, the elastic force decreases and the vibration-insulating effect is deteriorated. Therefore, in many cases, a fan unit constructed so as to hold a fan device in an elastic fan holder is fixed to the housing of electronic equipment by using a fixing member different from the fan unit, without screwing the fan holder itself.

For example, Patent Literature 1 describes a fixing structure that fixes a fan unit to electronic equipment by using, as the above-mentioned fixing member, a casing and a fixing bracket.

In this fixing structure, the fan unit in which a vibration proof fan cover is mounted is stored in the casing, and this casing is screwed to the fixing bracket, so that the casing is fixed to the fixing bracket.

At this time, the fan unit is elastically supported by the support projecting portions of the vibration proof fan cover within the space which is formed of the casing and the fixing bracket. The fixing bracket to which this casing is fixed is screwed to the housing of the electronic equipment, so that the fixing bracket is fixed to the housing.

In this way, the fan unit is fixed, via the casing and the fixing bracket, to the housing of the electronic equipment.

However, in the structure that uses the fixing member different from the fan unit, the number of components including the fixing member separately provided increases at all times, which leads to complication of the structure and increase in the cost of the structure.

Further, because the number of processes in the fixing work increases due to provision of the fixing member, the fixing work may be complicated, and the time required for the fixing work may be increased. Therefore, it is desirable that as the fixing structure for the fan unit, a structure not using such a fixing member as mentioned above is provided.

Patent Literature 1 also describes a fixing structure that does not use such a fixing member as above. In this fixing structure, space which is formed of both one surface of the housing of electronic equipment, and a part of chassis which is opposite to this surface is provided as fixing space for a fan unit.

The fan unit is inserted into the fixing space while support projecting portions of a vibration proof fan cover are press-fitted. At this time, the support projecting portions of the vibration proof fan cover are sandwiched between the surface of the housing and the part of the chassis, which construct the fixing space, in a state in which the surface of the housing and the part of the chassis are pressed.

As a result, the fan unit is elastically supported in the above-mentioned fixing space by the support projecting portions of the vibration proof fan cover.

However, because this fixing structure makes it difficult for an operator to recognize whether he or she has fixed the fan unit to an appropriate fixing position of the electronic equipment, the operator easily makes a mistake in the fixing of the fan unit. For example, the operator has nearly the same work feeling at a time when the fan unit reaches the bottom surface of the fixing space, i.e., at a time of inserting the fan unit to an appropriate fixing position, and at a time when the fan unit does not reach the bottom surface, i.e., at a time of inserting the fan unit to a halfway position. For this reason, there is a case in which even if the operator inserts the fan unit to a halfway position where the fan unit does not reach the bottom surface, he or she does not notice that.

The fan unit fixed to a halfway position in this way easily falls off the housing, and this can become a factor which decreases the productivity of the whole electronic equipment.

Further, even if the fan unit is fixed to a halfway position, the support projecting portions of the vibration proof fan cover are placed in a state in which the surface of the housing and the part of the chassis which construct the fixing space are pressed.

More specifically, the fan unit is elastically supported by the support projecting portions also when the fan unit is fixed to a halfway position. For this reason, there is a possibility that the electronic equipment in which the fan unit is placed at a halfway position is assembled as a product.

As the fixing position of the fan unit in the electronic equipment, an appropriate position at which a flow of air which suppresses a rise in the internal temperature of the electronic equipment within an allowable range is formed by the fan unit is designed. Therefore, there is a case in which in the electronic equipment in which the fan unit is not fixed appropriately to the fixing position, a nonuniform flow of air occurs in the housing and a rise in the internal temperature cannot be suppressed, and therefore there may occur an operation failure resulting from the temperature rise.

The present invention is made in order to solve the above-mentioned problems, and it is therefore an object of the present invention to provide a fan unit fixing structure and electronic equipment that can prevent a mistake from being made in the fixing of a fan unit, with a simple structure.

Solution to Problem

A fan unit fixing structure according to the present invention includes a fan unit, piece portions, first elastic engagement portions, second elastic engagement portions, a drawn portion, a second projecting portion, a contact portion, and a hitting portion. The fan unit has a fan device for rotating a fan, and an elastic holder for holding the fan device. The piece portions are provided at positions at which the fan unit placed at a fixing position in a housing is sandwiched between the piece portions from both sides thereof. The first elastic engagement portions are provided in an outer peripheral portion of the holder, the first elastic engagement portions corresponding to the piece portions. The second elastic engagement portions are provided in the piece portions, and are elastically engaged with the first elastic engagement portions in a state in which the fan unit is placed at the fixing position, to hold the fan unit at the fixing position. The drawn portion is provided so as to project toward the inside of the housing, serves as a base of the fan unit placed at the fixing position, and has a seat surface in which a hole is formed. The second projecting portion is provided so as to project from the outer peripheral portion of the holder, and is fitted into the hole in a state in which the fan unit is placed at the fixing position. The contact portion is provided so as to project from the outer peripheral portion on a periphery of the holder which is opposite to the second projecting portion. The hitting portion is disposed so as to project from a top plate, and is in contact with the contact portion while applying pressure to the contact portion, in a state in which the top plate is mounted to the housing.

Advantageous Effects of Invention

According to the present invention, the fan unit can be fixed to the housing with the simple structure using the first elastic engagement portions formed in the elastic holder, and the second elastic engagement portions formed in the piece portions in the housing. In addition, the second elastic engagement portions are elastically engaged with the first elastic engagement portions in the state in which the fan unit is placed at the fixing position. As a result, because a worker can check the fixing state of the fan unit from the existence or non-existence of a click feeling which is caused by this elastic engagement, the worker can be prevented from making a mistake in the fixing of the fan unit.

DESCRIPTION OF EMBODIMENTS

Hereafter, in order to explain this invention in greater detail, an embodiment of the present invention will be described with reference to accompanying drawings.
Embodiment 1

Figure 1:
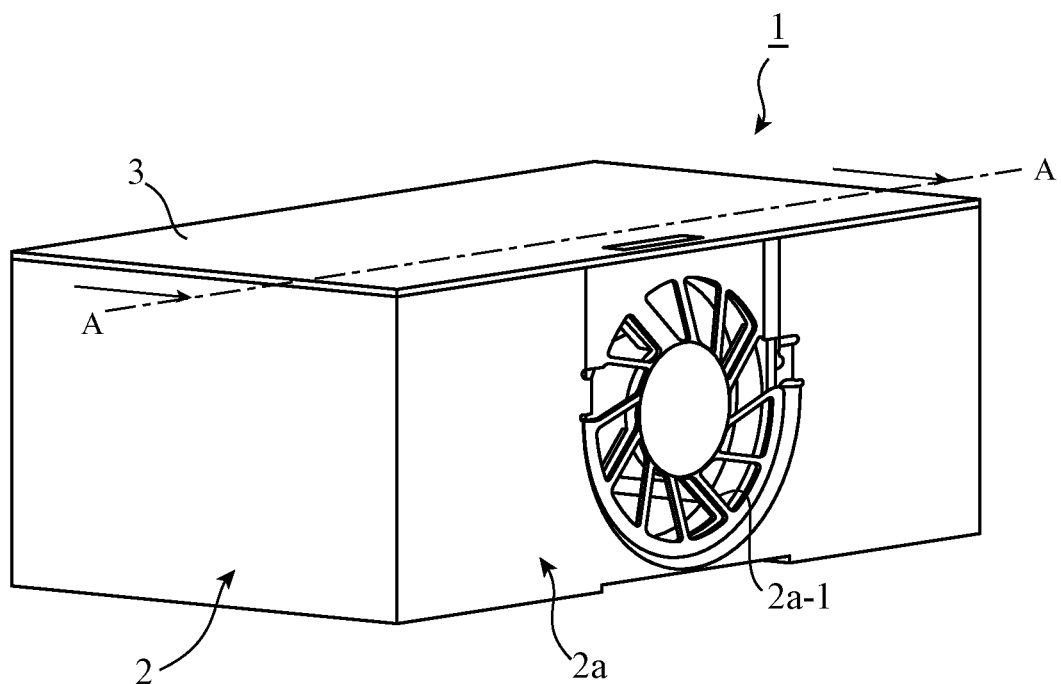
FIG. 1 is a perspective view showing electronic equipment according to Embodiment 1 of the present invention.
Figure 2:
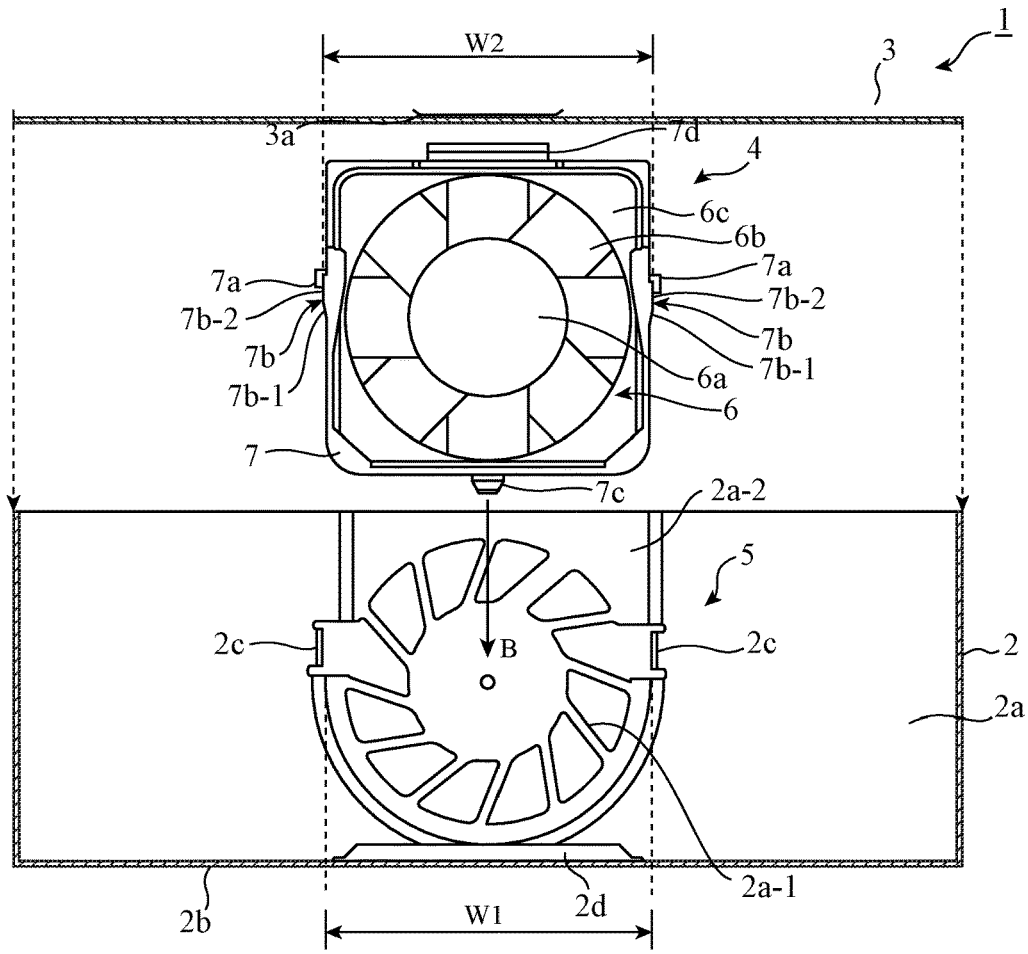
FIG. 2 is a cross-sectional view with arrows showing a state in which the electronic equipment according to Embodiment 1 is taken along the A-A line of FIG. 1 and exploded.
Figure 3:
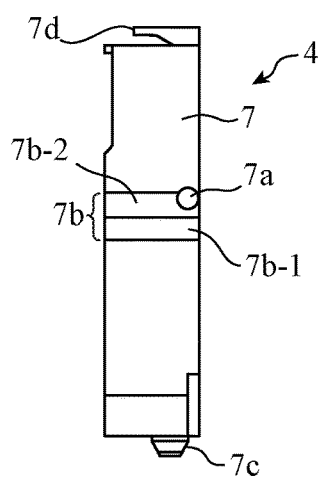
FIG. 3 is a side view showing a fan unit in Embodiment 1.

FIG. 1 is a perspective view showing electronic equipment 1 according to Embodiment 1 of the present invention. FIG. 2 is a cross-sectional view with arrows showing a state in which the electronic equipment 1 according to Embodiment 1 is taken along the A-A line of FIG. 1 and exploded. FIG. 3 is a side view showing a fan unit 4.

The electronic equipment 1 is provided with a fan unit fixing structure according to the present invention. For example, the electronic equipment is implemented as vehicle-mounted electronic equipment such as a navigation device. Further, in the electronic equipment 1, the fan unit 4 is stored in space which is formed by mounting a top plate 3 to a housing 2.

The housing 2 is a box-shaped member made from metal, such as a metal sheet, and having an opening in an upper surface thereof. In one side surface 2a of the housing, vent holes 2a-1 are formed. On an inner side of a portion of the side surface 2a in which the vent holes 2a-1 are formed, a fixing position 5 to which the fan unit 4 is fixed is provided.

Further, a fixing surface 2a-2 projecting toward the inside of the housing 2 is formed at the fixing position 5, and the fan unit 4 is fixed in the housing 2 in a state in which the fan unit is in contact with the fixing surface 2a-2.

Piece portions 2c are plate-shaped members extending toward the inside of the housing 2, and are provided with a space W1 apart on both right and left sides of the fixing surface 2a-2, as shown in FIG. 2.

More specifically, the piece portions 2c are provided at positions at which the fan unit 4 placed at the fixing position 5 of the housing 2 is sandwiched between the piece portions from both sides thereof.

A drawn portion 2d is provided by performing drawing on a bottom surface 2b of the housing 2 in such a way that the drawn portion projects toward the inside of the housing 2, so that the drawn portion serves as a base of the fan unit 4 placed at the fixing position 5.

A hitting portion 3a is provided by performing drawing on the top plate 3 in such a way that the hitting portion projects from the top plate 3, and is in contact with a contact portion 7*d* which will be mentioned below while applying pressure to the contact portion, in a state in which the top plate 3 is mounted to the housing 2.

The fan unit 4 is constructed so as to include a fan device 6 and a fan holder 7.

The fan device 6 includes a fan motor 6*a* that rotates a fan 6*b*, and a frame 6*c*, as shown in FIG. 2. The fan motor 6*a* has a motor rotating shaft to which the fan 6*b* is integrally fixed, and the fan 6*b* rotates with the motor rotating shaft. The frame 6*c* is constructed as a rectangular frame, and the fan motor 6*a* is supported by supporting branches extending inwardly from an edge portion of an opening of the frame 6*c*.

The fan holder 7 is a component embodying a holder according to the present invention. For example, as shown in FIG. 2, the fan holder 7 is a frame in which the fan device 6 is held in an inner circumference thereof. Further, the fan holder 7 is made from an elastic material, such as an elastomer, which absorbs vibrations occurring in the fan device 6. More specifically, the fan device 6 is fixed, via the elastic fan holder 7, to the fixing position 5.

Further, positioning projecting portions 7*a* are components embodying first elastic engagement portions according to the present invention, and are columnar members which correspond to the two piece portions 2*c,* and which are provided so as to project from both sides of the fan holder 7. As shown in FIG. 3, the positioning projecting portions 7*a* are formed integrally with positioning portions 7*b*-2, which will be mentioned below, in the fan holder 7, and have elasticity.

Raised portions 7*b* are provided by raising an outer peripheral portion of the fan holder 7, and formed of inclined portions 7*b*-1 and the positioning portions 7*b*-2, as shown in FIGS. 2 and 3.

Each of the inclined portions 7*b*-1 is raised in such a way as to project outwardly and gradually from the outer peripheral portion of the fan holder 7, and a part of each of the inclined portions, the part projecting most outwardly, is connected to the corresponding positioning portion 7*b*-2.

The positioning portions 7*b*-2 are projections projecting outwardly from the outer peripheral portion of the fan holder 7, and are in contact with the piece portions 2*c* in a state in which the fan unit 4 is placed at the fixing position 5.

Because a space W2 between the positioning portions 7*b*-2 in the raised portions 7*b* on the right and left sides of the fan holder 7 is narrower than the above-mentioned space W1 between the piece portions 2*c* on both the right and left sides, the positioning portions 7*b*-2 are in contact with the piece portions 2*c* while applying pressure to the piece portions.

A positioning projecting portion 7*c* is provided so as to project from a bottom portion of the fan holder 7, as shown in FIG. 2, and is fitted into a hole 2*d*-1, which will be mentioned below, in the state in which the fan unit 4 is placed at the fixing position 5. More specifically, the positioning projecting portion 7*c* is fitted into the hole 2*d*-1 in a state in which the fan unit 4 is in contact with the drawn portion 2*d*.

A contact portion 7*d* is a projection which is provided so as to project from the outer peripheral portion of the fan holder 7 which is opposite to the positioning projecting portion 7*c*. Further, the contact portion 7*d* is a projection whose cross section is formed in an L shape, as shown in FIG. 3, and is crushed elastically and downwardly when a force is applied thereto from above.

Although in FIGS. 2 and 3 the case in which the number of contact portions 7*d* is one is shown, two or more contact portions 7*d* can be alternatively provided. More specifically, plural contact portions 7*d* can be provided as long as the contact portions are disposed within an area within which the contact portions can be in contact with the hitting portion 3*a* when the top plate 3 is mounted to the housing 2.

Next, the details of the fixing of the fan unit 4 to the housing 2 will be explained.

Figure 4:
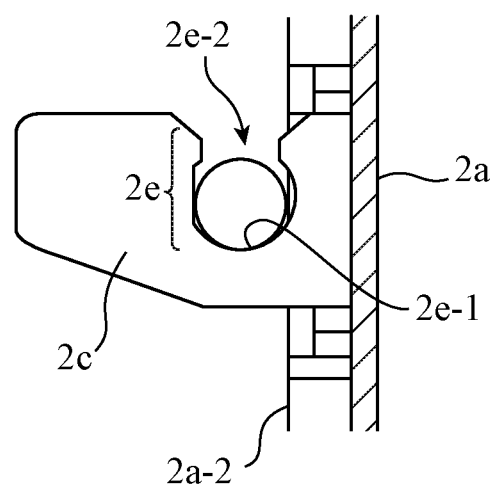
FIG. 4 is an enlarged side view showing a piece portion formed in a housing of the electronic equipment according to Embodiment 1.
Figure 5:
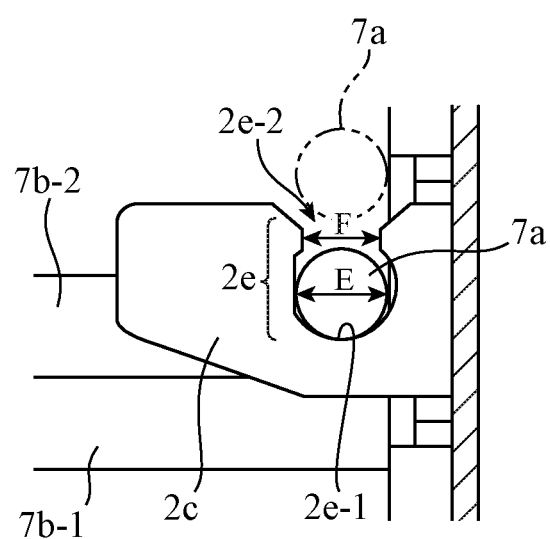
FIG. 5 is an enlarged side view showing a situation in which a positioning projecting portion of a fan holder in Embodiment 1 are fitted into and engaged with a notched portion of the piece portion.

FIG. 4 is an enlarged side view showing one piece portion 2*c* formed in the housing 2 of the electronic equipment 1. FIG. 5 is an enlarged side view showing a situation in which one positioning projecting portion 7*a* of the fan holder 7 is fitted into and engaged with the notched portion 2*e* of the piece portion 2*c*.

The notched portion 2*e* is a component embodying a second elastic engagement portion according to the present invention, and formed of a hole 2*e*-1 which is cut circularly and an open end 2*e*-2 formed in a part of the hole, as shown in FIG. 4.

In the fixing of the fan unit 4 to the housing 2, first, the fan unit 4 is inserted in a direction B toward the fixing position 5 while the fan unit 4 is made to be in contact with the fixing surface 2*a*-2 shown in FIG. 2.

The direction B is the one in which the fan unit 4 is inserted between the piece portions 2*c* on the right and left sides toward the drawn portion 2*d*. The fan unit 4 can be fixed to the fixing position 5 of the housing 2 only by performing the operation of inserting the fan unit in the direction B.

As mentioned above, the space W2 between the positioning portions 7*b*-2 in the raised portions 7*b* on the right and left sides of the fan holder 7 is narrower than the space W1 between the piece portions 2*c* on both the right and left sides.

Therefore, when the piece portions 2*c* are brought into contact with the inclined portions 7*b*-1 of the raised portions 7*b,* and, after that, the fan unit 4 is further inserted in the direction B, the piece portions 2*c* move in a direction in which the piece portions relatively go up the inclined surfaces, while applying pressure to the inclined portions 7*b*-1.

When the piece portions 2*c* reach the positioning portions 7*b*-2 of the raised portions 7*b,* the positioning projecting portions 7*a* of the fan holder 7 approach the open ends 2*e*-2 of the notched portions 2*e* in the piece portions 2*c,* as shown by a broken chain line in FIG. 5. Because the positioning projecting portions 7*a* have a diameter E greater than a width F of the open ends 2*e*-2, the positioning projecting portions 7*a* are stopped by the open ends 2*e*-2 when the fan unit 4 is further inserted.

In this state, when the fan unit 4 is further pressed in the direction B, the positioning projecting portions 7*a* are passed through the open ends 2*e*-2 while the positioning projecting portions become deformed elastically. When having passed the open ends 2*e*-2 thoroughly, the positioning projecting portions 7*a* are elastically fitted into and engaged with the holes 2*e*-1 because of the elastic restoring forces thereof. An operator can have a click feeling indicating that the fan unit 4 is fixed to an appropriate position through this operation.

In the state in which the positioning projecting portions 7*a* are fitted into the holes 2*e*-1, the fan unit 4 is in contact with the fixing surface 2*a*-2 of the housing 2, and the piece portions 2*c* are in contact with the positioning portions 7*b*-2 of the raised portions 7*b* while applying pressure to the positioning portions.

In this state, the fan unit 4 is held in the housing 2 by the piece portions 2*c* and the notched portions 2*e,* and is positioned in a front-and-rear direction and in a right-and-left direction.

The front-and-rear direction is the direction in which the fan unit 4 causes air to flow and the direction which is parallel to the rotating shaft of the fan device 6. Further, the right-and-left direction is the direction opposite to the opposite piece portions 2c, and an up-and-down direction is the direction in which the bottom surface 2b and the top plate 3 are arranged.

At the fixing position 5, the fan unit 4 is positioned and held in this way.

Because the operator can judge the fixing state of the fan unit 4 from the presence or absence of a click feeling, the operator can be prevented from making a mistake in the fixing of the fan unit 4.

Although the structure in which the positioning projecting portions 7a and the notched portions 2e are elastically engaged with each other is shown, the present invention is not limited to this structure.

For example, there can be provided a so-called snap-fit structure in which engaging hooks provided in the fan holder 7 are elastically fitted into and engaged with the holes provided in the piece portions 2c. More specifically, in the present invention, what is necessary is just to provide a structure which generates elastic engagement in the state in which the fan unit 4 is placed at the fixing position 5, thereby providing the operator with a click feeling.

Figure 6:
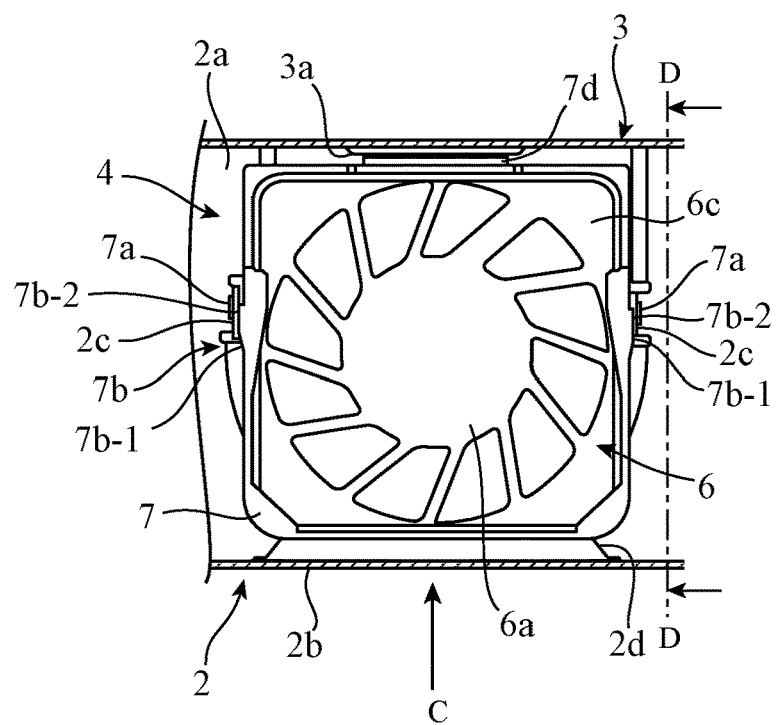
FIG. 6 is a front view showing a fan unit fixing structure according to Embodiment 1.
Figure 7:
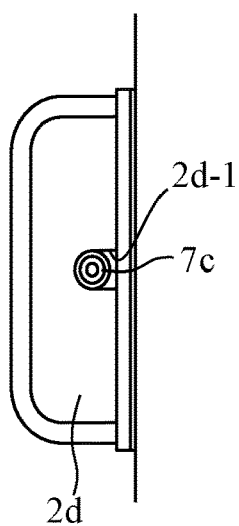
FIG. 7 is an enlarged view showing the fan unit fixing structure according to Embodiment 1 which is viewed from a direction C of FIG. 6.
Figure 8:
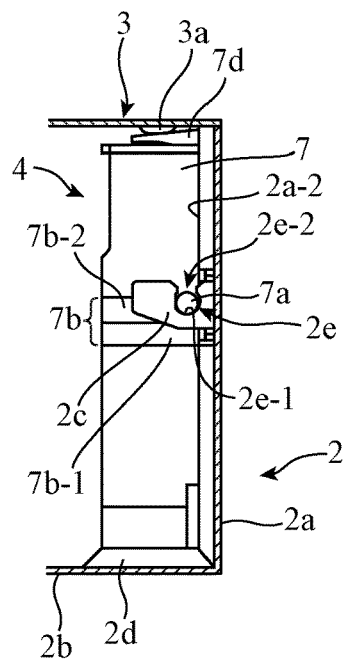
FIG. 8 is a cross-sectional view with arrows showing a state in which the fan unit fixing structure according to Embodiment 1 is taken along the D-D line of FIG. 6.

FIG. 6 is a front view showing the fan unit fixing structure according to Embodiment 1. Further, FIG. 7 is an enlarged view showing the fan unit fixing structure according to Embodiment 1 which is viewed from a direction C of FIG. 6. FIG. 8 is a cross-sectional view with arrows showing a state in which the fan unit fixing structure according to Embodiment 1 is taken along the D-D line of FIG. 6.

As shown in FIGS. 6 and 8, when the positioning projecting portions 7a are fitted into the holes 2e-1, the fan unit 4 is placed in a state in which the fan unit sits on the drawn portion 2d. In this state, the positioning projecting portion 7c of the fan holder 7 is fitted into the hole 2d-1 of the drawn portion 2d, as shown in FIG. 7, and the fan unit 4 is in contact with the fixing surface 2a-2. As a result, a lower portion of the fan unit 4 is also positioned in the front-and-rear direction and in the right-and-left direction.

Further, after the fan unit 4 is held at the fixing position 5, the top plate 3 is mounted to the housing 2. At this time, the hitting portion 3a of the top plate 3 is brought into contact with the contact portion 7d formed in an upper portion of the fan holder 7 while applying pressure to the contact portion.

If the reaction force of the contact portion 7d is too large compared with the pressure from the hitting portion 3a, there occurs a trouble that the top plate 3 is made to rise by the contact portion 7d.

In contrast with this, the contact portion 7d is formed so as to have an L-shaped cross section, and has a structure in which when a force is applied thereto from above, the contact portion becomes deformed elastically in such a way as to be crushed downwardly, as shown in FIG. 8. The reaction force decreases due to this elastic deformation, so that the top plate 3 does not rise.

The fan unit 4 is thus positioned in the up-and-down direction by the drawn portion 2d and the hitting portion 3a. Therefore, because the fan unit 4 is positioned at the fixing position 5 in the front-and-rear direction, in the right-and-left direction, and in the up-and-down direction, the fan unit is held in the housing 2 without looseness.

Figure 9:
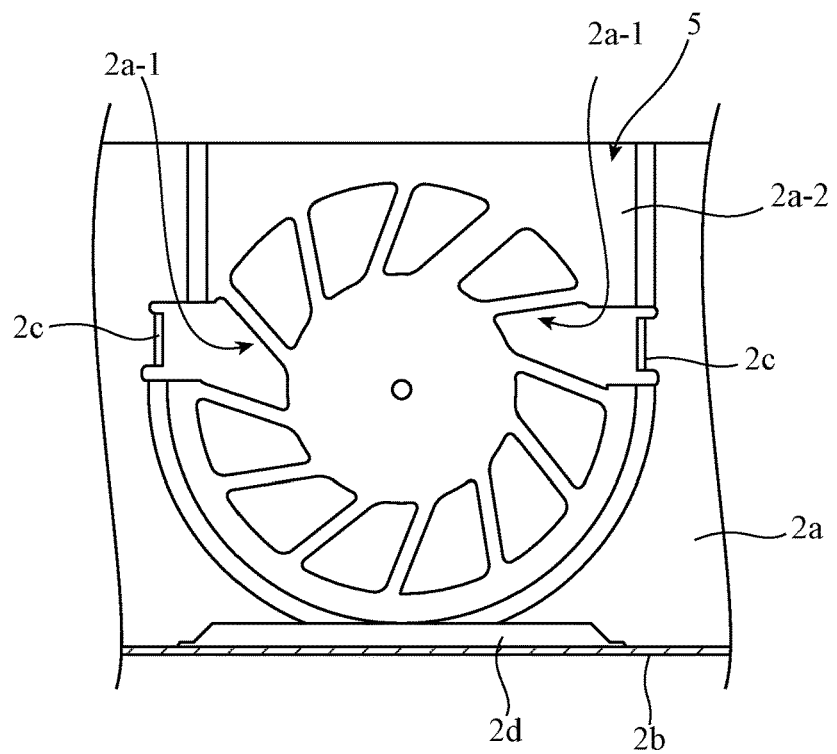
FIG. 9 is a front view showing a fixing position in the housing of the electronic equipment according to Embodiment 1.

FIG. 9 is a front view showing the fixing position 5 in the housing 2 of the electronic equipment 1 according to Embodiment 1. As shown in FIG. 9, vent holes 2a-1 are openings which are formed when parts of the housing 2 are cut and bent as the piece portions 2c.

Conventionally, in a case in which parts of a housing 2 made from a metal sheet are cut and bent to provide piece portions, it is necessary to take a measure of filling openings formed in portions from which the piece portions are cut and bent, in order to prevent a foreign object from invading the inside of the housing from the outside.

In contrast with this, according to the present invention, the above-mentioned openings are used as vent holes 2a-1. As a result, it becomes unnecessary to fill the above-mentioned openings, and the metal sheet which constructs the housing 2 can be used efficiently.

As mentioned above, in the fan unit fixing structure according to Embodiment 1, the notched portions 2e of the piece portions 2c are elastically engaged with the positioning projecting portions 7a to hold the fan unit 4 at the fixing position 5, in the state in which the fan unit 4 is placed at the fixing position 5. Particularly, the positioning projecting portions 7a are projections that project from an outer peripheral portion of the fan holder 7, and the notched portions 2e are open in such a way that the widths of their open ends 2e-2 are narrower than those of the positioning projecting portions 7a. The positioning projecting portions 7a are elastically fitted into the notched portions 2e in the state in which the positioning projecting portions have passed the open ends 2e-2.

As a result, without using screws or other fixing members, the fan unit 4 can be fixed to the housing 2 with the simple structure using the positioning projecting portions 7a formed in the fan holder 7, and the notched portions 2e of the piece portions 2c formed in the housing 2.

In addition, an operator can easily recognize that the fan unit 4 is placed at the appropriate fixing position 5 from a click feeling which is generated by the elastic engagement.

Therefore, the operator can judge the fixing state of the fan unit from the presence or absence of a click feeling, and can be prevented from making a mistake in the fixing of the fan unit 4.

The fan unit fixing structure according to Embodiment 1 also includes the raised portions 7b provided in an outer peripheral portion of the fan holder 7, and being in contact with the piece portions 2c while applying pressure to the piece portions 2c, in the state in which the fan unit 4 is placed at the fixing position 5.

With such a configuration, the fan unit 4 can be positioned in the right-and-left direction in which the raised portions 7b are provided.

The fan unit fixing structure according to Embodiment 1 further includes the drawn portion 2d, the positioning projecting portion 7c, the contact portion 7d, and the hitting portion 3a.

The drawn portion 2d is provided so as to project toward the inside of the housing 2, serves as a base of the fan unit 4 placed at the fixing position 5, and has a seat surface in which the hole 2d-1 is formed. The positioning projecting portion 7c is provided so as to project from the outer peripheral portion of the holder 7, and is fitted into the hole 2d-1 in the state in which the fan unit 4 is placed at the fixing position 5.

The contact portion 7d is provided so as to project from the outer peripheral portion of the holder 7 which is opposite to the positioning projecting portion 7c. The hitting portion 3a is provided so as to project from the top plate 3, and is in contact with the contact portion 7d while applying pressure to the contact portion, in the state in which the top plate 3 is mounted to the housing 2.

With such a configuration, the fan unit 4 can be positioned in the up-and-down direction in which the fan unit is sandwiched between the drawn portion 2d and the hitting portion 3a. Further, because the positioning projecting portion 7c is fitted into the hole 2d-1, the fan unit 4 can be positioned in the front-and-rear direction and in the right-and-left direction.

In addition, in the fan unit fixing structure according to Embodiment 1, vent holes 2a-1 via which air is made to flow into and out of the housing 2 by rotations of the fan are openings which are formed when parts of the housing 2 are cut and bent as the piece portions 2c. With such a configuration, it becomes unnecessary to fill the openings formed in portions from which the piece portions are cut and bent, and the metal sheet which constructs the housing 2 can be used efficiently.

It is noted that various changes can be made in any component according to the embodiment, and any component according to the embodiment can be omitted within the scope of the invention.

INDUSTRIAL APPLICABILITY

Because the fan unit fixing structure according to the present invention causes the fan unit to be fixed to an appropriate fixing position in the housing, the fan unit fixing structure is suitable for, for example, vehicle-mounted electronic equipment to which vibrations caused by a travel of a vehicle are applied.

REFERENCE SIGNS LIST 1 electronic equipment, 2 housing, 2a side surface, 2a-1 vent hole, 2a-2 fixing surface, 2b bottom surface, 2c piece portion, 2d drawn portion, 2d-1, 2e-1 hole, 2e notched portion, 2e-2 open end, 3 top plate, 3a hitting portion, 4 fan unit, 5 fixing position, 6 fan device, 6a fan motor, 6b fan, 6c frame, 7 fan holder, 7a, 7c positioning projecting portion, 7b raised portion, 7b-1 inclined portion, 7b-2 positioning portion, and 7d contact portion.

The invention claimed is:

1. A fan unit fixing structure comprising:
a fan unit having a fan device for rotating a fan, and an elastic holder for holding the fan device;
piece portions provided at positions at which the fan unit placed at a fixing position in a housing is sandwiched between the piece portions from both sides thereof;
first elastic engagement portions provided in an outer peripheral portion of the holder, the first elastic engagement portions corresponding to the piece portions;
second elastic engagement portions provided in the piece portions, and elastically engaged with the first elastic engagement portions in a state in which the fan unit is placed at the fixing position, to hold the fan unit at the fixing position;
a drawn portion provided so as to project toward an inside of the housing, serving as a base of the fan unit placed at the fixing position, and having a seat surface in which a hole is formed;
a second projecting portion provided so as to project from the outer peripheral portion of the holder, and fitted into the hole in a state in which the fan unit is placed at the fixing position;
a contact portion provided so as to project from the outer peripheral portion on a periphery of the holder which is opposite to the second projecting portion; and
a hitting portion provided so as to project from a top plate, and being in contact with the contact portion while applying pressure to the contact portion, in a state in which the top plate is mounted to the housing.

2. The fan unit fixing structure according to claim 1, wherein the first elastic engagement portions are first projecting portions projecting from the outer peripheral portion of the holder, and the second elastic engagement portions are notched portions provided in the piece portions and having an open part whose width is narrower than a width of the first projecting portions, and
wherein the first projecting portions are elastically fitted into the notched portions in a state in which the first projecting portions have passed the open part.

3. The fan unit fixing structure according to claim 1, further comprising raised portions provided in the outer peripheral portion of the holder, and being in contact with the piece portions while applying pressure to the piece portions, in a state in which the fan unit is placed at the fixing position.

4. A fan unit fixing structure comprising:
a fan unit having a fan device for rotating a fan, and an elastic holder for holding the fan device;
piece portions provided at positions at which the fan unit placed at a fixing position in a housing is sandwiched between the piece portions from both sides thereof;
first elastic engagement portions provided in an outer peripheral portion of the holder, the first elastic engagement portions corresponding to the piece portions; and
second elastic engagement portions provided in the piece portions, and elastically engaged with the first elastic engagement portions in a state in which the fan unit is placed at the fixing position, to hold the fan unit at the fixing position,
wherein vent holes via which air is made to flow into and out of the housing by rotations of the fan are openings which are formed when parts of the housing are cut and bent as the piece portions.

5. The fan unit fixing structure according to claim 4, wherein the first elastic engagement portions are first projecting portions projecting from the outer peripheral portion of the holder and the second elastic engagement portions are notched portions provided in the piece portions and having an open part whose width is narrower than a width of the first projecting portions, and
wherein the first projecting portions are elastically fitted into the notched portions in a state in which the first projecting portions have passed the open part.

6. The fan unit fixing structure according to claim 4, further comprising raised portions provided in the outer peripheral portion of the holder, and being in contact with the piece portions while applying pressure to the piece portions, in a state in which the fan unit is placed at the fixing position.

7. Electronic equipment comprising:
a fan unit having a fan device for rotating a fan, and an elastic holder for holding the fan device;
a housing to which the fan unit is fixed;
piece portions provided at positions at which the fan unit placed at a fixing position in the housing is sandwiched between the piece portions from both sides thereof;
first elastic engagement portions provided in an outer peripheral portion of the holder, the first elastic engagement portions corresponding to the piece portions;
second elastic engagement portions provided in the piece portions, and elastically engaged with the first elastic engagement portions in a state in which the fan unit is placed at the fixing position, to hold the fan unit at the fixing position;

a drawn portion provided so as to project toward an inside of the housing, serving as a base of the fan unit placed at the fixing position, and having a seat surface in which a hole is formed;

a second projecting portion provided so as to project from the outer peripheral portion of the holder, and fitted into the hole in a state in which the fan unit is placed at the fixing position;

a contact portion provided so as to project from the outer peripheral portion on a periphery of the holder which is opposite to the second projecting portion; and a hitting portion provided so as to project from a top plate, and being in contact with the contact portion while applying pressure to the contact portion, in a state in which the top plate is mounted to the housing.

* * * * *